(12) United States Patent
Droz et al.

(10) Patent No.: US 10,746,945 B1
(45) Date of Patent: Aug. 18, 2020

(54) SYSTEMS AND METHODS FOR LASER DIODE ALIGNMENT

(71) Applicant: WAYMO LLC, Mountain View, CA (US)

(72) Inventors: Pierre-yves Droz, Mountain View, CA (US); Augusto Tazzoli, Mountain View, CA (US); David Schleuning, Mountain View, CA (US); Nathaniel Golshan, Mountain View, CA (US); David Hutchison, Mountain View, CA (US)

(73) Assignee: Waymo LLC, Mountain View, CA (US)

( * ) Notice: Subject to any disclaimer, the term of this patent is extended or adjusted under 35 U.S.C. 154(b) by 312 days.

(21) Appl. No.: 15/727,849

(22) Filed: Oct. 9, 2017

(51) Int. Cl.
| | |
|---|---|
| *B32B 41/00* | (2006.01) |
| *G02B 6/42* | (2006.01) |
| *H01S 5/022* | (2006.01) |
| *G01S 7/481* | (2006.01) |
| *H01S 5/40* | (2006.01) |

(52) U.S. Cl.
CPC .......... *G02B 6/4225* (2013.01); *G01S 7/4815* (2013.01); *G02B 6/4226* (2013.01); *G02B 6/4227* (2013.01); *G02B 6/4239* (2013.01); *H01S 5/02252* (2013.01); *H01S 5/02284* (2013.01); *H01S 5/4025* (2013.01)

(58) Field of Classification Search
CPC .. G02B 6/4225; G02B 6/4227; G02B 6/4226; G02B 6/4239; G01S 7/4815; H01S 5/02252; H01S 5/02284; H01S 5/4025
USPC .................. 156/60, 64, 350, 351, 378, 379
See application file for complete search history.

(56) References Cited

U.S. PATENT DOCUMENTS

| | | | |
|---|---|---|---|
| 4,884,015 A * | 11/1989 | Sugimoto | B23Q 1/36 318/640 |
| 5,311,535 A * | 5/1994 | Karpinski | H01S 5/4012 372/36 |
| 5,498,972 A | 3/1996 | Cavaliere et al. | |
| 5,815,251 A | 9/1998 | Ehbets et al. | |
| 6,501,260 B1 | 12/2002 | Hu et al. | |
| 7,068,891 B1 | 6/2006 | Cook et al. | |
| 9,645,389 B2 | 5/2017 | Kumeta et al. | |

* cited by examiner

*Primary Examiner* — Michael N Orlando
*Assistant Examiner* — Joshel Rivera
(74) *Attorney, Agent, or Firm* — McDonnell Boehnen Hulbert & Berghoff LLP

(57) ABSTRACT

The present disclosure relates to systems and methods directed to alignment of light-emitting devices. An example method includes coupling a support substrate to a light guide assembly. The support substrate includes a plurality of elongate structures and a plurality of laser diodes. Each laser diode of the plurality of laser diodes is coupled to a respective elongate structure of the plurality of elongate structures. The method also includes causing a given laser diode of the plurality of laser diodes to emit light toward the light guide assembly. The light guide assembly includes a light guide manifold configured to guide at least a portion of the emitted light as transmitted light. The method additionally includes comparing at least one optical characteristic of the transmitted light to a desired optical characteristic and, based on the comparison, adjusting a position of the given laser diode by adjusting the respective elongate structure.

20 Claims, 9 Drawing Sheets

SYSTEMS AND METHODS FOR LASER DIODE ALIGNMENT

BACKGROUND

Unless otherwise indicated herein, the materials described in this section are not prior art to the claims in this application and are not admitted to be prior art by inclusion in this section.

Optical systems may utilize light-emitting devices for a variety of purposes. In some scenarios, obtaining correct alignment of such light-emitting devices may be an important consideration with regard to the performance of the optical system.

In the case of light detection and ranging (LIDAR) devices, a plurality of light sources may emit light into a given environment to provide estimated distances to objects in that environment. In such an example, misalignment of the light-emitting devices may provide poor system performance or incorrect distance information, which may lead to imprecise localization of objects in the environment.

Conventional optical systems may include various means for active or passive light-emitting device alignment, such as mechanical alignment mechanisms.

SUMMARY

Systems and methods described herein are applicable to the manufacture of optical systems. For example, the present disclosure provides structures and techniques for active alignment of a laser diode assembly with respect to other elements of an optical system, such as a light guide assembly and a receive assembly.

In a first aspect, a method is provided. The method includes coupling a support substrate to a light guide assembly. The support substrate includes a plurality of elongate structures and a plurality of laser diodes. Each laser diode of the plurality of laser diodes is coupled to a respective elongate structure of the plurality of elongate structures. The method includes causing a given laser diode of the plurality of laser diodes to emit light toward the light guide assembly. The light guide assembly includes a light guide manifold configured to guide at least a portion of the emitted light as transmitted light. The method includes determining at least one optical characteristic of the transmitted light. The method also includes comparing the at least one optical characteristic of the transmitted light to a desired optical characteristic of the transmitted light. The method yet further includes, based on the comparison, adjusting a position of the given laser diode relative to the light guide assembly by at least adjusting the respective elongate structure coupled to the given laser diode.

In a second aspect, a system is provided. The system includes a support substrate that includes a plurality of elongate structures and a plurality of laser diodes. Each laser diode of the plurality of laser diodes is coupled to a respective elongate structure of the plurality of elongate structures. The system also includes a light guide assembly coupled to the support substrate. The light guide assembly includes a light guide manifold configured to guide light. The system additionally includes a detector and a controller having at least one processor and a memory. The at least one processor executes program instructions stored in the memory so as to carry out operations. The operations include causing a given laser diode of the plurality of laser diodes to emit light toward the light guide assembly as transmitted light and receiving, from a detector, information indicative of at least one optical characteristic of the transmitted light. The operations further include comparing the at least one optical characteristic of the transmitted light to a desired optical characteristic and adjusting, based on the comparison, a position of the given laser diode relative to the light guide assembly by at least adjusting the respective elongate structure coupled to the given laser diode.

Other aspects, embodiments, and implementations will become apparent to those of ordinary skill in the art by reading the following detailed description, with reference where appropriate to the accompanying drawings.

DETAILED DESCRIPTION

Figure 1:
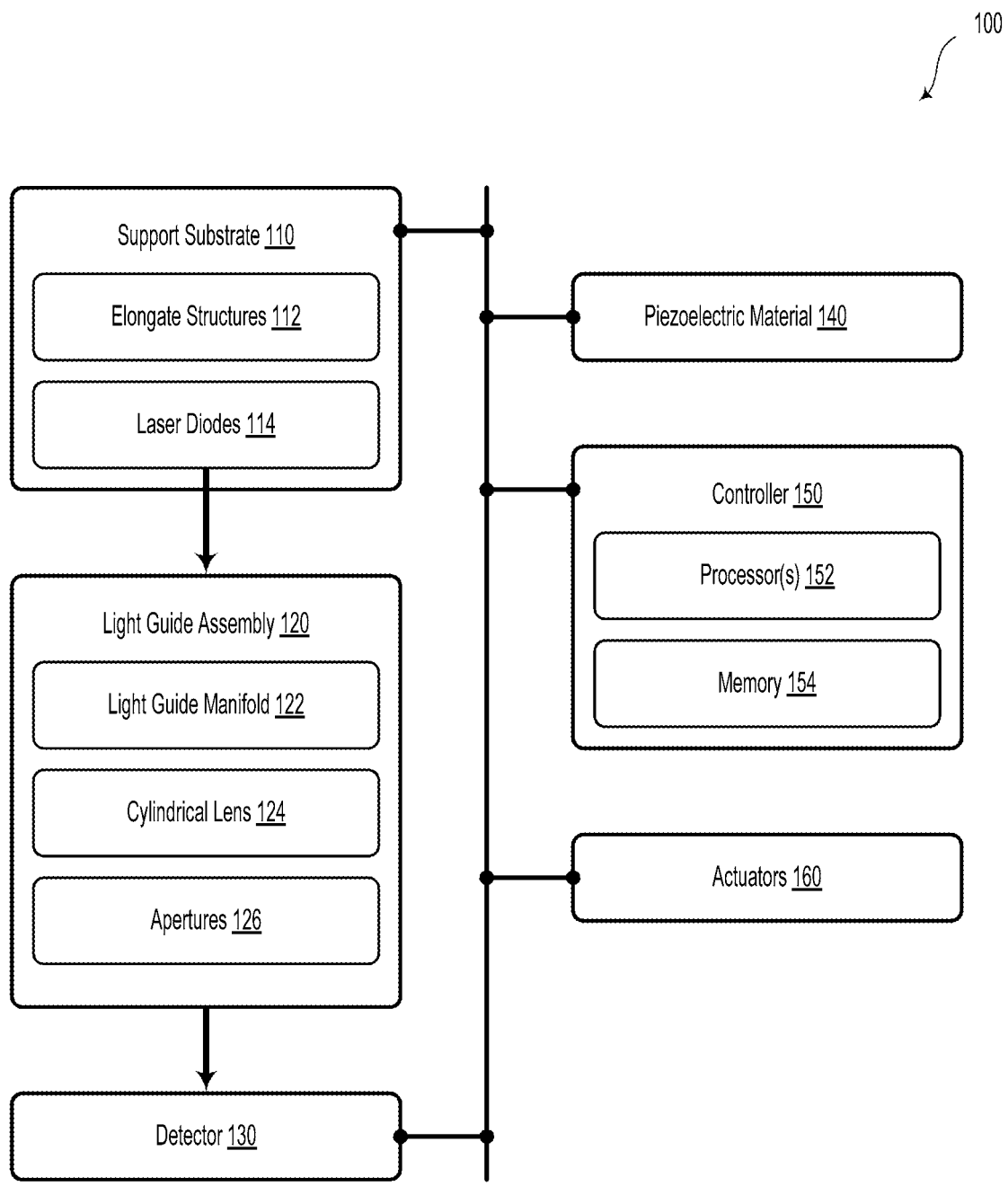
FIG. 1 illustrates a system, according to an example embodiment.

Example methods, devices, and systems are described herein. It should be understood that the words "example" and "exemplary" are used herein to mean "serving as an example, instance, or illustration." Any embodiment or feature described herein as being an "example" or "exemplary" is not necessarily to be construed as preferred or advantageous over other embodiments or features. Other embodiments can be utilized, and other changes can be made, without departing from the scope of the subject matter presented herein.

Thus, the example embodiments described herein are not meant to be limiting. Aspects of the present disclosure, as generally described herein, and illustrated in the figures, can be arranged, substituted, combined, separated, and designed in a wide variety of different configurations, all of which are contemplated herein.

Further, unless context suggests otherwise, the features illustrated in each of the figures may be used in combination with one another. Thus, the figures should be generally viewed as component aspects of one or more overall embodiments, with the understanding that not all illustrated features are necessary for each embodiment.

I. Overview

Precise alignment of optical systems—during manufacture and/or under ordinary use conditions—can be important in optical systems used for applications such as LIDAR, where precise spatial and temporal delivery and reception of light pulses is necessary. The use of feedback during active optical alignment may provide a way to achieve the necessary level of spatial and temporal precision in such systems.

Systems and methods described herein relate to the manufacture of optical systems. Example embodiments include structures and techniques for actively aligning a laser diode assembly with other elements of an optical system, such as a light guide assembly and a receive assembly. In some embodiments, the receive assembly may include a filter/pinhole array and a detector array. In an example embodiment, the laser diode assembly may include a support substrate, which may include a base portion and a finger portion. For example, the finger portion may include a plurality of elongate structures that extend away from the base portion. One or more laser diodes may be coupled proximate to the elongate structures. The light guide assembly may include a light guide and an optically-transparent substrate (e.g., glass). The light guide may include a mirror portion configured to reflect light in a first direction along an optical axis substantially perpendicular to the optically transparent substrate. In some embodiments, the light guide assembly may include a cylindrical lens (e.g., an optical fiber).

An example method includes a rough fixing step that includes coupling the base portion of the support substrate to the optically-transparent substrate. For example, the base portion may be fastened to the optically-transparent substrate using an epoxy or another type of adhesive. The method includes causing the laser diode to emit laser light. The laser light is coupled, at least in part, into the light guide toward the mirror portion. The laser light may interact with the mirror portion such that the laser light is reflected along the optical axis as transmitted light. At least a portion of the reflected light may interact with objects in an environment of the optical system and be reflected or scattered back toward the detector array as received light.

The method includes adjusting a position of the one or more laser diodes by providing pressure against respective elongate structures of the support substrate. In an example embodiment, the laser diode position may be adjusted based on the transmitted light and/or the received light. In other words, near field, far field, or received light intensity may be used to provide one or more desired characteristics of the received light and/or the transmitted light.

In an example embodiment, varying amounts of pressure could be applied to each finger while causing the respective laser diode to emit light until the transmission light pattern in the near and/or far fields is similar or identical to a desired light pattern. For example, the far field may diverge at a desired angle (e.g., based on f2.0 lens optics) and the near field properties may form a sharp point-like image.

In some embodiments, methods may include that once the desired optical characteristics of the received and/or transmitted light are achieved, the given laser diode and elongate structure could be fixed in place to the light guide assembly and/or the receive assembly. In some embodiments, the given laser diode and elongate structure could be partially fixed in place before alignment (e.g., by application of a relatively-slow-curing epoxy). Once alignment is achieved, the laser diode and the elongate structure can then be left in place until the adhesive is fully cured (e.g., clamped or otherwise fixed or unmoved). In such a scenario, laser diode alignment may be provided for a plurality of laser diodes and elongate structures of an optical system.

II. Example Systems

FIG. 1 illustrates a system 100, according to an example embodiment. In some embodiments, system 100 may include a transmitter subsystem for a light detection and ranging (LIDAR) system. Such a LIDAR system may be configured to provide information (e.g., point cloud data) about one or more objects (e.g., location, shape, etc.) in a given environment. In an example embodiment, the LIDAR system could provide point cloud information, object information, mapping information, or other information to a vehicle. The vehicle could be a semi- or fully-automated vehicle. For instance, the vehicle could be a self-driving car, an autonomous drone aircraft, an autonomous truck, or an autonomous robot. Other types of vehicles and LIDAR systems are contemplated herein.

As illustrated in FIG. 1, system 100 includes a support substrate 110, a light guide assembly 120, and a detector 130. In some embodiments, system 100 may include a piezoelectric material 140 and/or one or more actuators 160.

In example embodiments, the support substrate 110 includes a plurality of elongate structures 112 and a plurality of laser diodes 114. In such scenarios, each laser diode of the plurality of laser diodes 114 is coupled to a respective elongate structure of the plurality of elongate structures 112. That is, in some examples, a laser diode may be coupled to each elongate structure.

In some embodiments, the plurality of elongate structures 112 may be coupled in a finger-like arrangement to a base portion of the support substrate 110. That is, each of the plurality of elongate structure 112 may be coupled to, and/or protrude from, the base portion of the support substrate 110. In some examples, the plurality of elongate structures 112 may be arranged with respect to the base portion in a similar fashion as tines of a fork. However, other arrangements of the elongate structures 112 are possible and contemplated herein.

The support substrate 110 may include a plurality of cut-outs that may define the plurality of elongate structures 112. In such scenarios, a stiffness of, and/or flexibility of, the plurality of elongate structures 112 may be controlled and/or determined by a size, shape, and/or number of the cut-outs in the support substrate 110. As an example, an aspect ratio of the plurality of elongate structures 112 may be adjusted by changing a shape (e.g., a length) of the cut-outs in the support substrate 110. As such, the flexibility of the plurality of elongate structures 112 may be proportional to the aspect ratio of the cut-outs in the support substrate 110.

In some embodiments, the plurality of laser diodes 114 could include one or more light-emitting sources, such as one or more semiconductor lasers, one or more laser bars, vertical-cavity emitting lasers (VCSELs), or other types of laser structures. In such scenarios, the plurality of laser diodes 114 may be operable to emit light in the near infrared wavelength range. However, other wavelengths and/or wavelength ranges are possible. In some examples, the plurality of laser diodes 114 may be operable to emit light pulses into an external environment of the system 100, so as to obtain, for example, point cloud information about the external environment.

The light guide assembly 120 is coupled to the support substrate 110. Furthermore, the light guide assembly 120 includes a light guide manifold 122 configured to guide at least a portion of light emitted from the plurality of laser diodes 114. Additionally, the light guide assembly 120 may include at least one cylindrical lens 124. In example embodiments, the plurality of laser diodes 114 are configured to emit light toward the light guide assembly 120 as transmitted light. Furthermore, the light guide manifold 122 may include a polymeric waveguide. In such a scenario, at least a portion of the transmitted light may be guided by the light guide manifold 122.

In some embodiments, the light guide manifold 122 may be coupled to one or more apertures 126. In such scenarios, at least a portion of the transmitted light is transmitted through the one or more apertures 126. As an example, the light guide manifold 122 may be coupled to an aperture plate having a plurality of apertures 126.

In some embodiments, the detector 130 may be operable to detect light emitted by the plurality of laser diodes 114. Furthermore, the detector 130 could include a complementary metal-oxide semiconductor (CMOS) image sensor. Additionally or alternatively, the detector 130 may include at least one of a silicon photomultiplier (SiPM), a linear mode avalanche photodiode (LMAPD), a PIN diode, a bolometer, and/or a photoconductor. It will be understood that other types of photodetectors (and arrangements thereof) are possible and contemplated herein.

System 100 also includes a controller 150 having a memory 154 and at least one processor 152. The at least one processor 152 may include, for instance, an application-specific integrated circuit (ASIC) or a field-programmable gate array (FPGA). Other types of processors, computers, or devices configured to carry out software instructions are contemplated herein. The memory 154 may include a non-transitory computer-readable medium, such as, but not limited to, read-only memory (ROM), programmable read-only memory (PROM), erasable programmable read-only memory (EPROM), electrically erasable programmable read-only memory (EEPROM), non-volatile random-access memory (e.g., flash memory), a solid state drive (SSD), a hard disk drive (HDD), a Compact Disc (CD), a Digital Video Disk (DVD), a digital tape, read/write (R/W) CDs, R/W DVDs, etc.

The controller 150 may include a computer disposed on a vehicle, an external computer, or a mobile computing platform, such as a smartphone, tablet device, personal computer, wearable device, etc. Additionally or alternatively, the controller 150 may include, or be connected to, a remotely-located computer system, such as a cloud server. In an example embodiment, the controller 150 may be configured to carry out some or all method blocks or steps described herein.

As an example, the at least one processor 152 may execute instructions stored in the memory 154 so as to carry out certain operations. The operations may include some or all of the functions, blocks, or steps described herein. In some embodiments, different computing devices or controllers may carry out the various functions, blocks, or steps described herein, in various combinations.

The operations include causing a given laser diode of the plurality of laser diodes 114 to emit light toward the light guide assembly 120 as transmitted light. In such a scenario, at least a portion of the emitted light may interact with the at least one cylindrical lens 124 and the light guide manifold 122. In some embodiments, the transmitted light may be guided by the light guide manifold 122 (e.g., by total internal reflection) toward the one or more apertures 126.

The operations also include receiving, from detector 130, information indicative of at least one optical characteristic of the transmitted light.

The operations additionally include comparing the at least one optical characteristic of the transmitted light to a desired optical characteristic.

The operations further include adjusting, based on the comparison, a position of the given laser diode relative to the light guide assembly 120 by at least adjusting the respective elongate structure coupled to the given laser diode.

In cases where system 100 includes a piezoelectric material 140, the piezoelectric material may be incorporated into the plurality of elongate structures 112, the laser diodes 114, or the support substrate 110 generally. In such scenarios, adjusting the respective elongate structure coupled to the given laser diode could include adjusting a voltage or current applied to the piezoelectric material 140.

In scenarios where system 100 includes one or more actuators 160, adjusting the respective elongate structure coupled to the given laser diode may include adjusting a position of the one or more actuators 160 so as to move the respective elongate structure.

In some embodiments, adjusting the position of the given laser diode relative to the light guide assembly may be performed until the optical characteristic of the transmitted light corresponds to the desired optical characteristic. In such scenarios, in response to having properly adjusted the position of the given laser diode relative to the light guide assembly, the operations may include maintaining the relative position between the given laser diode and the light guide assembly.

Additionally, the operations may also include determining, based on the information received from the detector 130, at least one of: a sharpness of an image of the transmitted light at a near field location, an angle of divergence of the transmitted light at a far field location, a photon flux of the transmitted light, or a focus spot diameter of the transmitted light.

III. Example Methods

FIGS. 2A-2G illustrate various blocks of a method of manufacture, according to one or more example embodiments. It will be understood that at least some of the various blocks may be carried out in a different order than of that presented herein. Furthermore, blocks may be added, subtracted, transposed, and/or repeated. FIGS. 2A-2G may serve as example illustrations for at least some of the blocks or steps described in relation to method 300. Additionally, some elements of FIGS. 2A-2G may be similar or identical to elements of system 100, as illustrated and described in reference to FIG. 1.

Figure 2A:
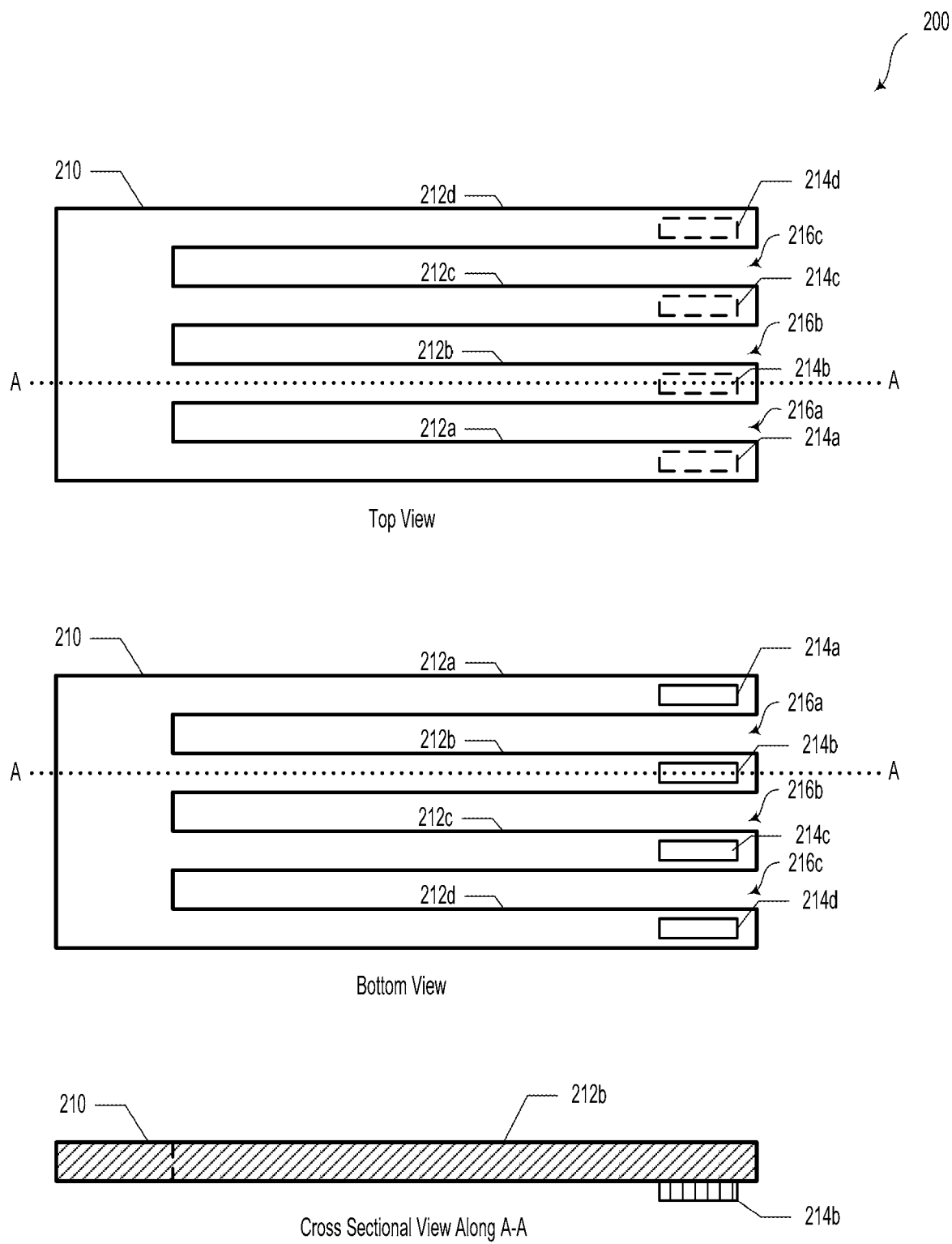
FIG. 2A illustrates a block of a method of manufacture, according to an example embodiment.

FIG. 2A illustrates a block 200 of a method of manufacture, according to an example embodiment. FIG. 2A illustrates top, bottom, and cross-sectional views of a support substrate 210. Block 200 may include providing the support substrate 210, which may include a plurality of elongate structures 212a-d. The plurality of elongate structures 212a-d may be formed by a plurality of cut-outs 216a-c in the support substrate 210. The plurality of cut-outs 216a-c could be shaped like notches or narrow slits in the support substrate 210. However, other shapes for the plurality of cut-outs 216a-c are possible and contemplated herein.

In some embodiments, a plurality of laser diodes 214a-d may be coupled to the plurality of elongate structures 212a-d. For example, laser diode 214a may be physically coupled to elongate structure 212a. In an example embodiment, the plurality of laser diodes 214a-d may be coupled to the plurality of elongate structures 212a-d at a location that is distal with respect to a base portion of the support substrate 210. That is, each laser diode may be located near a free, or unconnected, end of a respective elongate structure.

It will be understood that while the plurality of elongate structures 212a-d are arranged on the support substrate 210 in a fashion similar to that of tines on a fork, or keys on a piano keyboard, other arrangements are possible and contemplated herein.

Figure 2B:
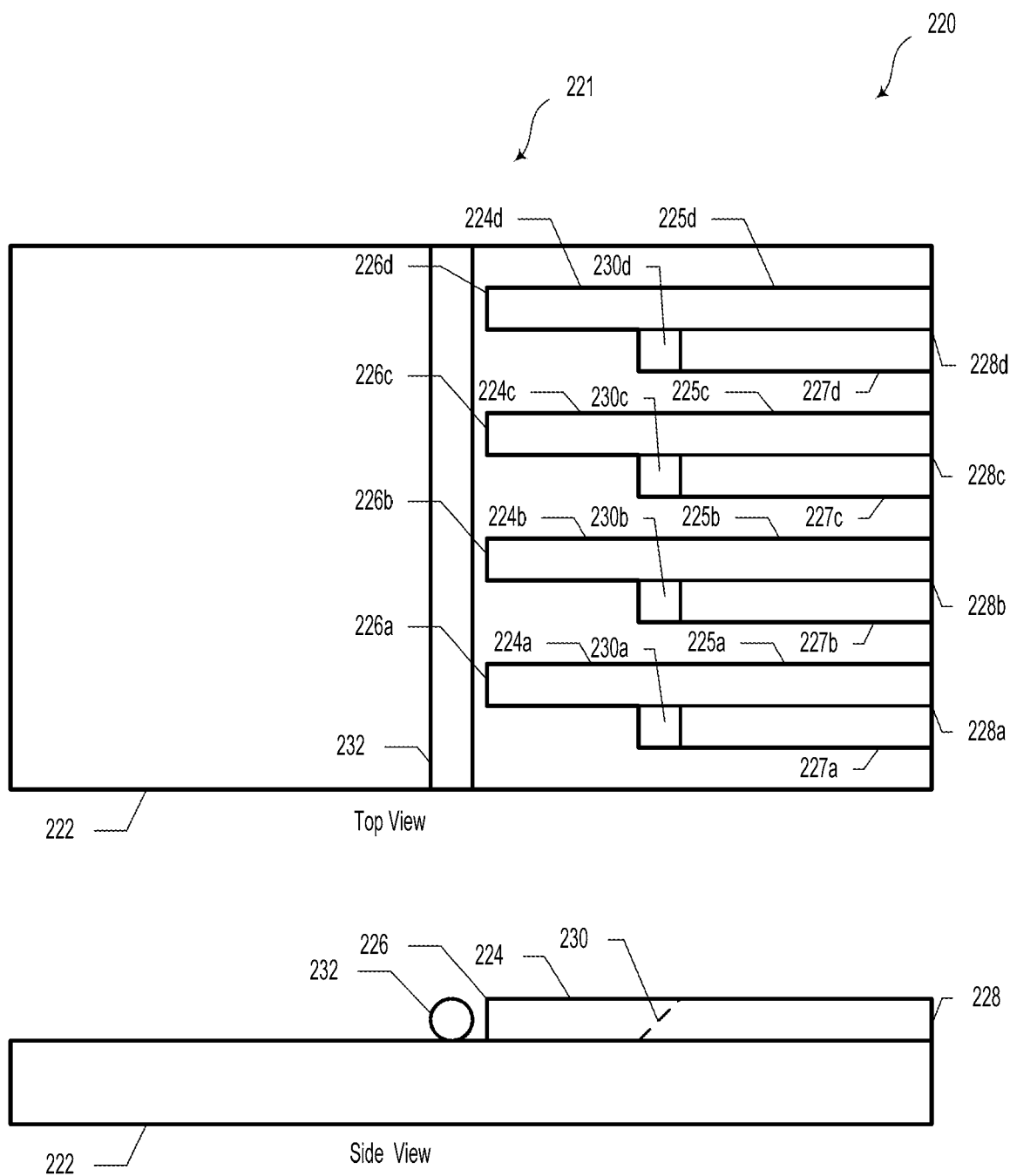
FIG. 2B illustrates a block of a method of manufacture, according to an example embodiment.

FIG. 2B illustrates a block 220 of a method of manufacture, according to an example embodiment. Block 220 includes providing a light guide assembly 221. The light guide assembly 221 includes a further substrate 222, which may be substantially transparent to wavelengths of light emitted by the plurality of laser diodes 214a-d.

The light guide assembly 221 also includes a plurality of light guide manifolds 224a-d. In an example embodiment, each of the plurality of light guide manifolds 224a-d may be arranged along a surface of the further substrate 222. In some cases, the plurality of light guide manifolds 224a-d may be arranged in a row-like arrangement. However, other arrangements (e.g., a staggered arrangement) are possible and contemplated herein. The light guide manifolds 224a-d may be configured to efficiently guide light emitted by the plurality of laser diodes 214a-d.

The light guide manifolds 224a-d may include respective transmitted light portions 225a-d and respective received light portions 227a-d. Furthermore, the light guide manifolds 224a-d may include respective input facets 226a-d and output facets 228a-d. Additionally, in some embodiments, the light guide manifolds 224a-d may include respective angled portions 230a-d. In an example embodiment, the angled portions 230a-d may be coated with metal, a dielectric stack, or another material (or combination of materials) configured to substantially reflect wavelengths of light similar or identical to light emitted by the plurality of laser diodes 214a-d. In some cases, the angled portions 230a-d may be configured to reflect received light from an external environment. In an example embodiment, the angled portions 230a-d may be configured to reflect the received light through the further substrate 222.

In an example embodiment, the light guide assembly 221 also includes a cylindrical lens 232. The cylindrical lens 232 may be coupled to the further substrate 222. In some cases, the cylindrical lens 232 may include an optical fiber. However, other types of lenses are possible. Furthermore, while a single lens is illustrated in FIG. 2B, it will be understood that a plurality of lenses (e.g., one lens per light guide manifold) are contemplated.

Figure 2C:
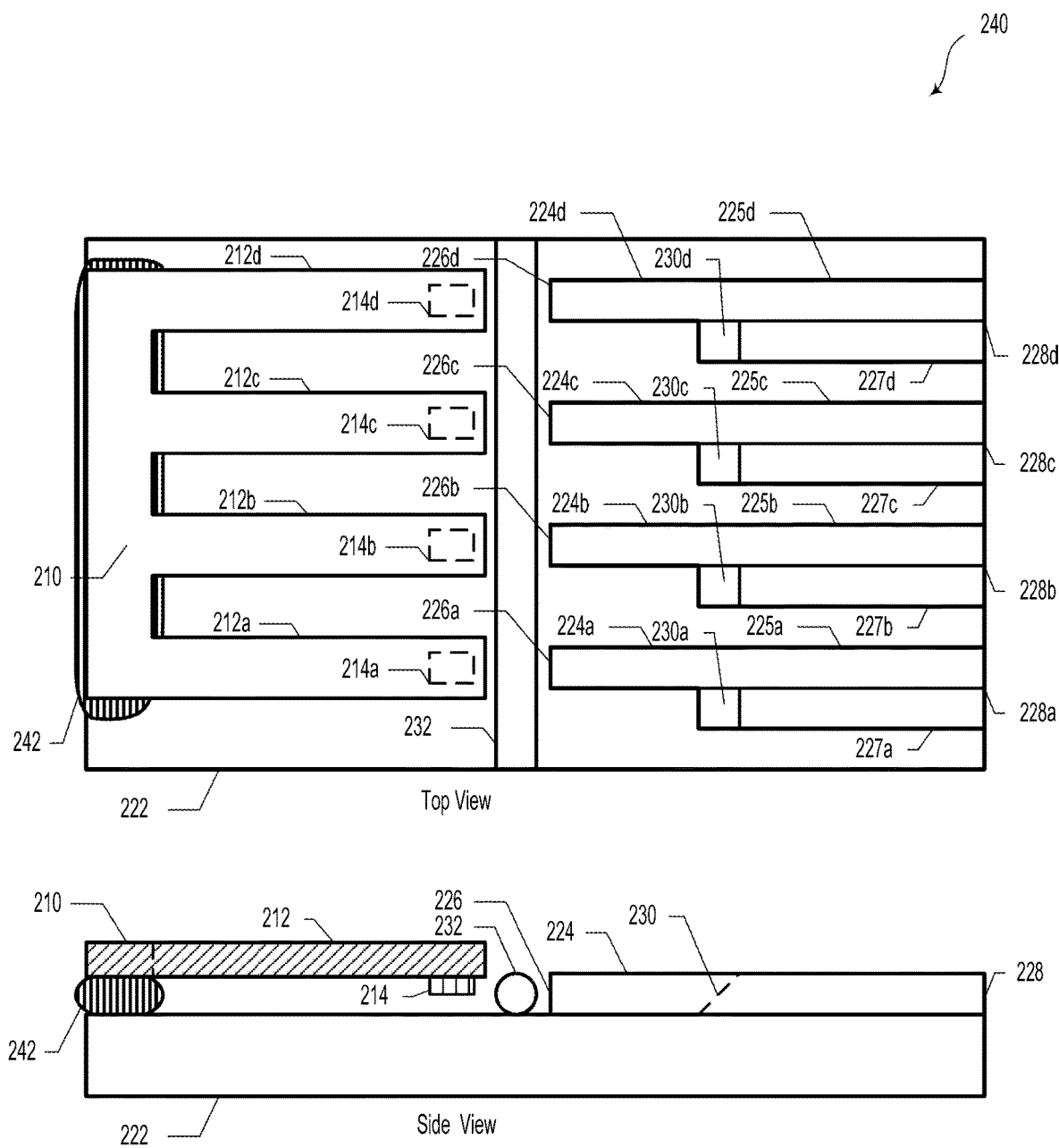
FIG. 2C illustrates a block of a method of manufacture, according to an example embodiment.

FIG. 2C illustrates a block 240 of a method of manufacture, according to an example embodiment. Block 240 includes coupling the support substrate 210 to the further substrate 222. As illustrated, block 240 may include applying a slow-curing epoxy 242 to one or both of the support substrate 210 and/or the further substrate 222. While the slow-curing epoxy 242 is illustrated as being applied to a base portion of the support substrate 210, the slow-curing epoxy may be applied to one or more other locations on the support substrate 210 and/or the further substrate 222.

In an example embodiment, upon coupling the support substrate 210 and the further substrate 222, the laser diode 214 may be located substantially near the cylindrical lens 232.

Figure 2D:
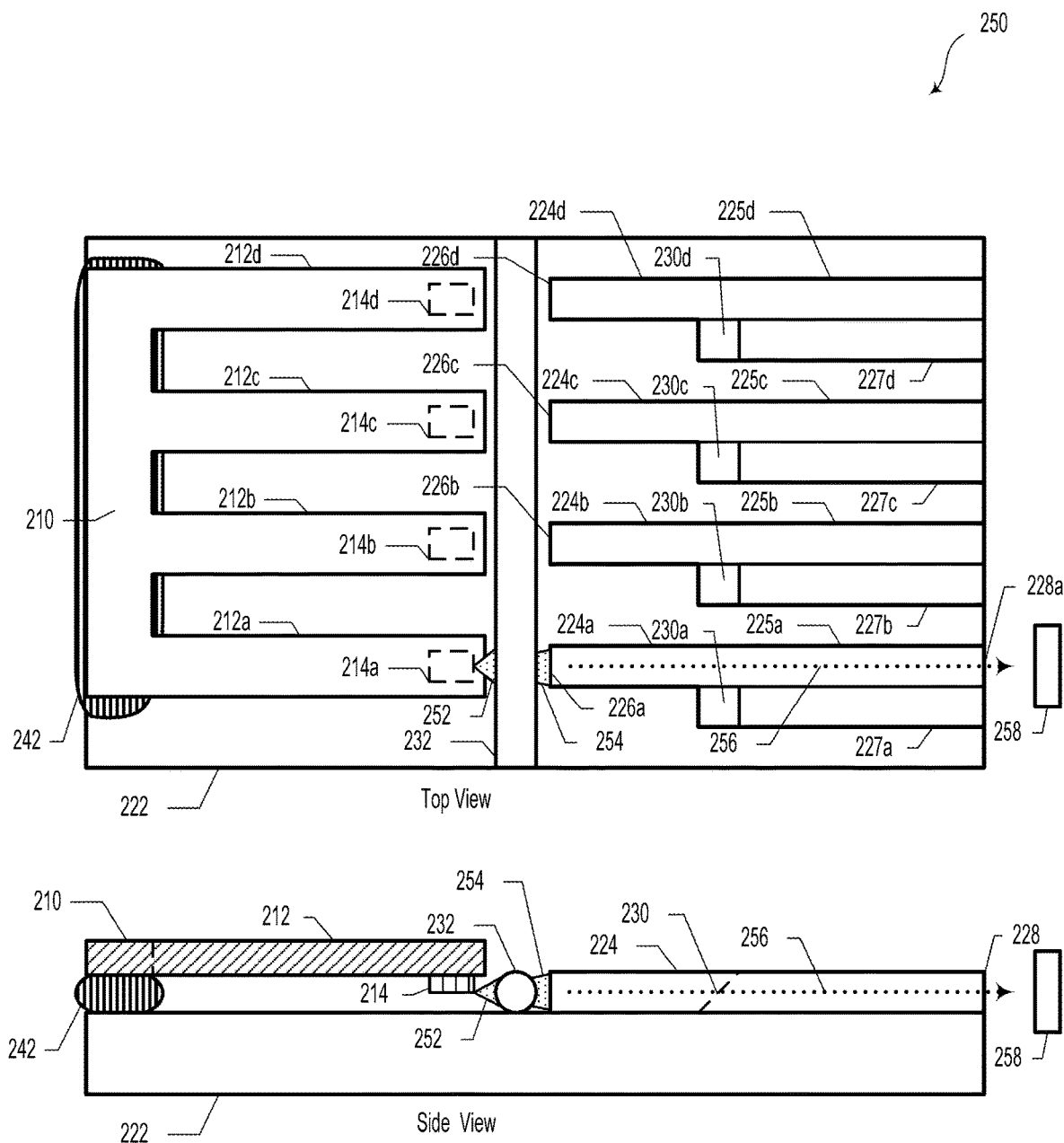
FIG. 2D illustrates a block of a method of manufacture, according to an example embodiment.

FIG. 2D illustrates a block 250 of a method of manufacture, according to an example embodiment. Block 250 may include causing a laser diode (e.g., laser diode 214a) to emit light toward the cylindrical lens 232 and the light guide manifold 224 (e.g., light guide manifold 224a). In an example embodiment, the laser diode 214a may emit light 252, which may be emitted in a divergent beam. At least a portion of the light 252 may interact with the cylindrical lens 232 so as to provide focused light 254, which may be transmitted toward an input facet 226a of the light guide manifold 224a. A portion of the focused light 254 may be optically coupled into, and guided by, the transmitted light portion 225a of the light guide manifold 224a as transmitted light 256. In an example embodiment, at least a portion of the transmitted light 256 may exit an output facet 228a. In some embodiments, the transmitted light 256 may be received and/or measured by a detector 258.

Figure 2E:
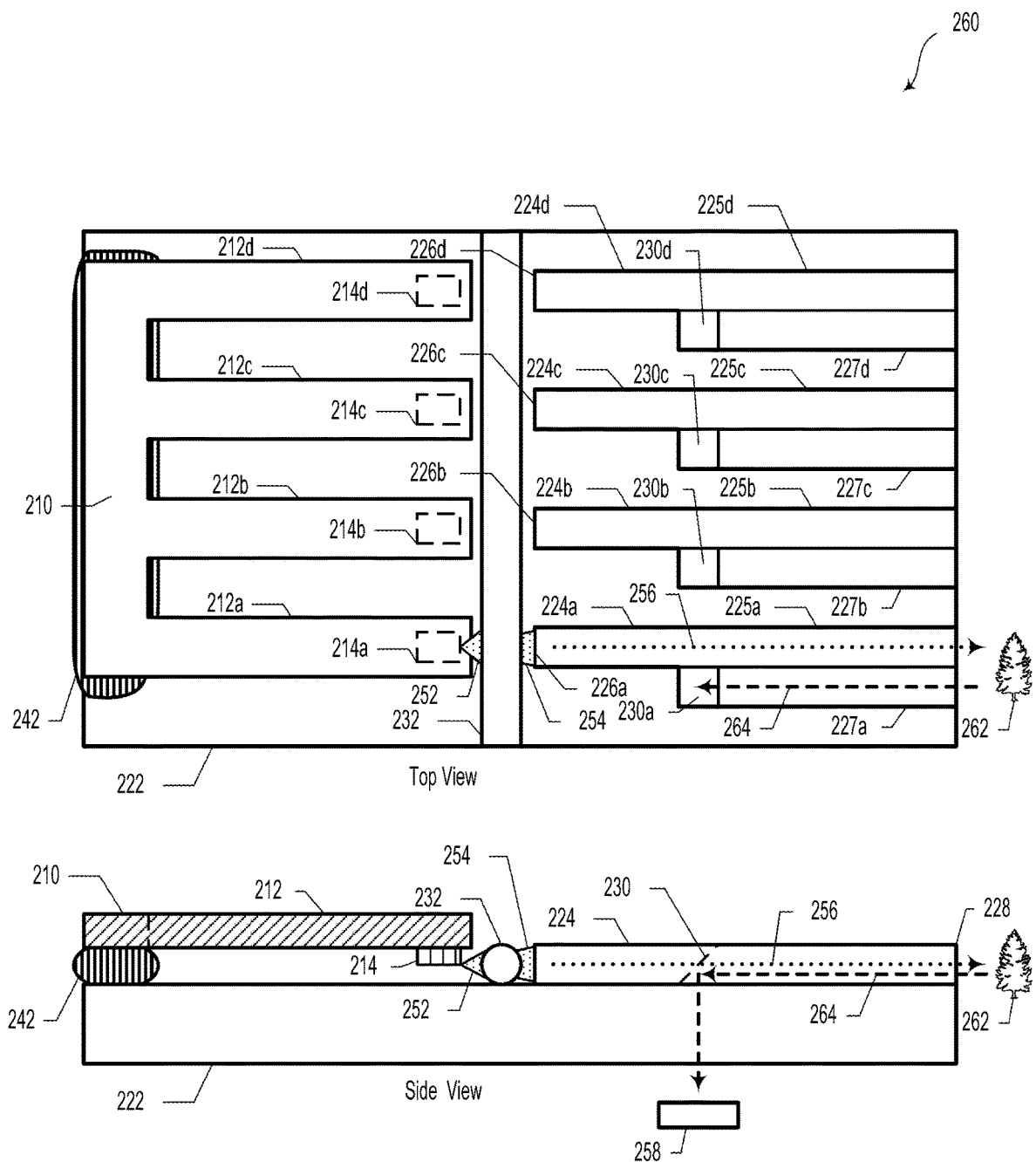
FIG. 2E illustrates a block of a method of manufacture, according to an example embodiment.

FIG. 2E illustrates a block 260 of a method of manufacture, according to an example embodiment. Block 260 illustrates an alternative way to obtain feedback to perform the active alignment methods described herein. In an example embodiment, at least a portion of the transmitted light 256 may be transmitted into an environment of the optical system. As an example, the transmitted light 256 may interact with (e.g., reflect from) an object 262 in the environment of the optical system. A portion of the transmitted light 256 may be reflected and received by way of the received light portion 227a of the light guide manifold 224a as reflected light 264. The reflected light 264 may be reflected from the angled portion 230a, through the further substrate 222 (which may be an optically-transparent substrate), and towards a detector 258, where the light may be collected and/or measured.

Figure 2F:
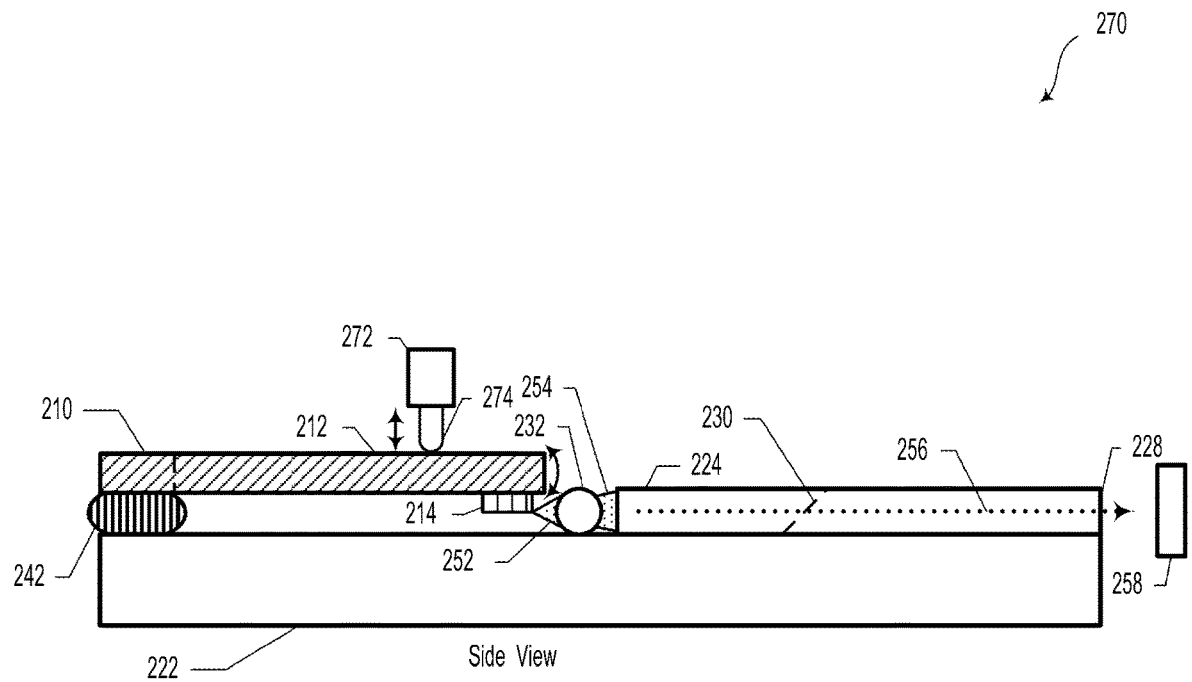
FIG. 2F illustrates a block of a method of manufacture, according to an example embodiment.
Figure 2F:
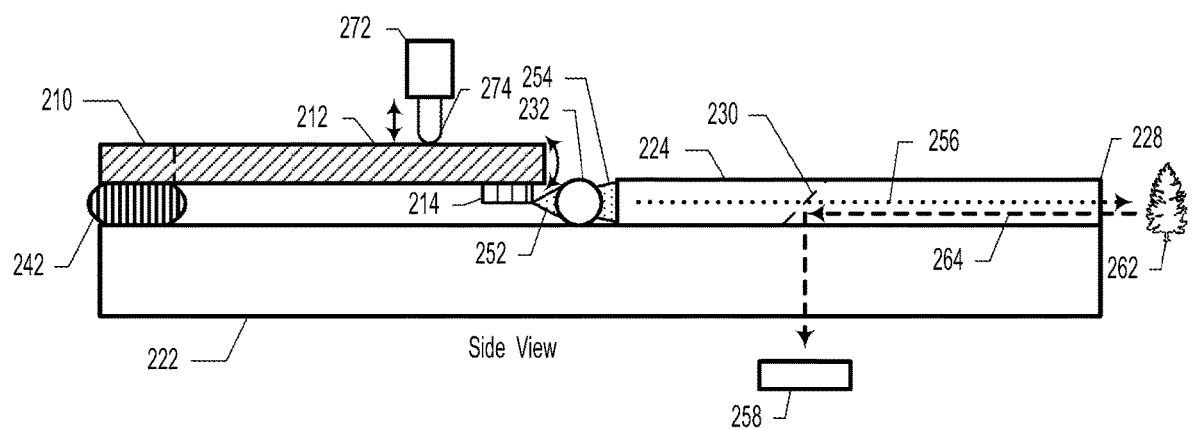

FIG. 2F illustrates a block 270 of a method of manufacture, according to an example embodiment. Block 270 illustrates adjusting a position of an elongate structure 212 using an actuator 272. For example, the actuator 272 may include a finger 274, a plunger, a piston, or another type of effector configured to directly or indirectly cause the elongate structure 212 to move. In an example embodiment, the actuator 272 may apply a force on the elongate structure 212 so as to adjust an angle of the laser diode 214 with respect to the cylindrical lens 232, or otherwise adjust a relative position of the laser diode 214 and the cylindrical lens 232 and/or the light guide manifold 224.

As described above, the optical system may be operated in transmission (with detector 258 detecting transmitted light 256) or in reflection (with detector 258 detecting reflected light 264).

In an example embodiment, the detector 258 may provide information (e.g., to a controller) indicative of an optical characteristic of the transmitted light 256 and/or the reflected light 264. Such information may be compared to one or more desired optical characteristics of the transmitted light 256 or the reflected light 264. In some embodiments, adjusting the position of the elongate structure 212 may be performed based on the comparison. For example, if a beam spot location is determined to be at a location other than a desired beam spot location, the position of the respective elongate structure could be adjusted until the observed beam spot location is at, or near, the desired beam spot location.

Figure 2G:
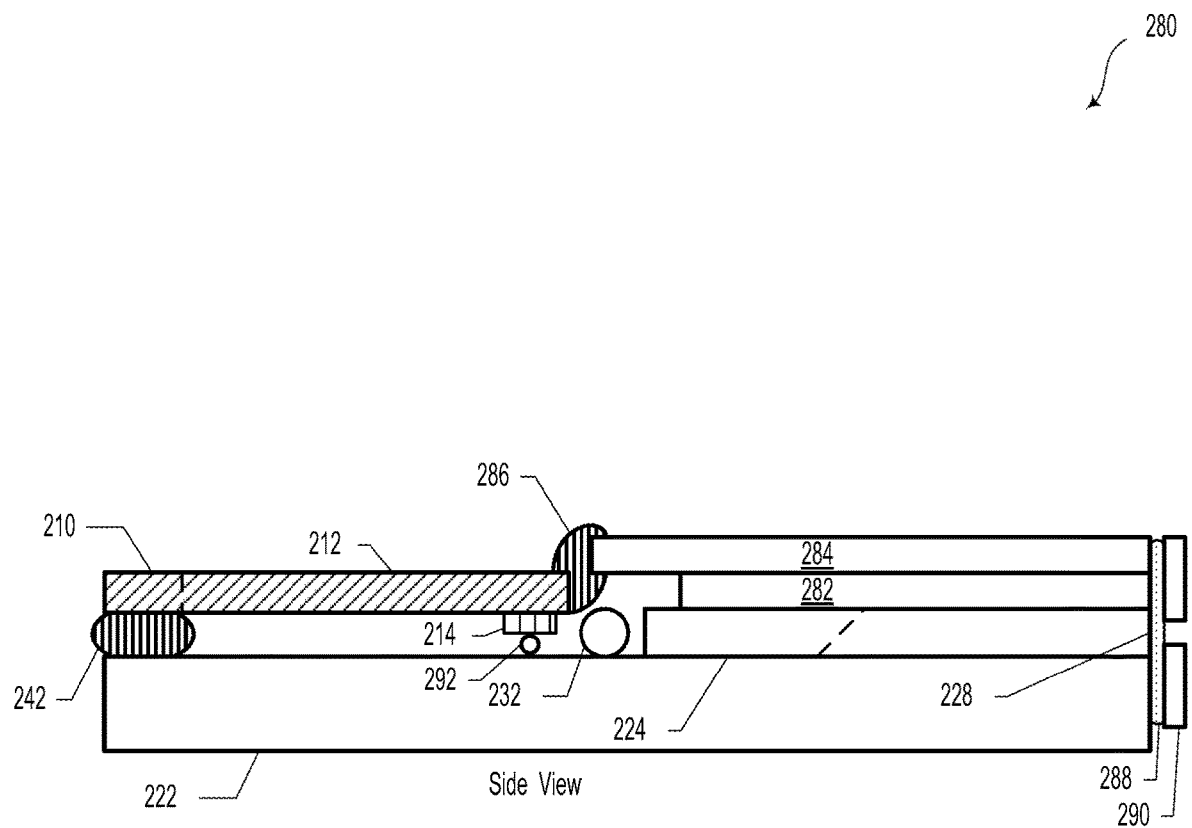
FIG. 2G illustrates a block of a method of manufacture, according to an example embodiment.

FIG. 2G illustrates a block 280 of a method of manufacture, according to an example embodiment. In an example embodiment, block 280 may include a fixing step. The fixing step may include maintaining the position of the elongate structure until the slow-curing epoxy 242 becomes cured or otherwise becomes solidified.

In some embodiments, an upper substrate 284 may be coupled to the light guide manifold 224 via an optical adhesive 282. In such a scenario, a second amount of slow-curing epoxy 286 could be applied between the elongate structure 212 and the upper substrate 284.

Furthermore, in some cases, an aperture plate 290 may be coupled to the output facet 228 of the light guide manifold 224 via an index-matching material 288. The index-matching material 288 may have an index of refraction that is similar or identical to that of the light guide manifold 224.

In an example embodiment, the aperture plate 290 may include a plurality of aperture openings. In some cases, each aperture opening may correspond to a given output facet 228 of the plurality of light guide manifolds. The aperture plate 290 may be formed of metal or another opaque material.

In some embodiments, one or more steps or blocks of the methods of manufacturing described herein may include one or more physical stops. For example, an optical fiber 292 may be provided between the substrate 222 and the laser diode 214. In such a scenario, the optical fiber 292 may act as a stop for the laser diode 214. As such, the support substrate 210 and the elongate structure 212 may be passively aligned, at least in a vertical direction, to the cylindrical lens 232 and light guide manifold 224. In other words, the optical fiber 292 may fill the gap between the laser die 214 and the substrate 222 and may act as a hard stop to reference the vertical position of the laser die 214 relative to the cylindrical lens 232. It will be understood that other variations involving physical stops and/or registration marks are possible within the scope of the present disclosure. All such other variations are expressly contemplated herein.

Figure 3:
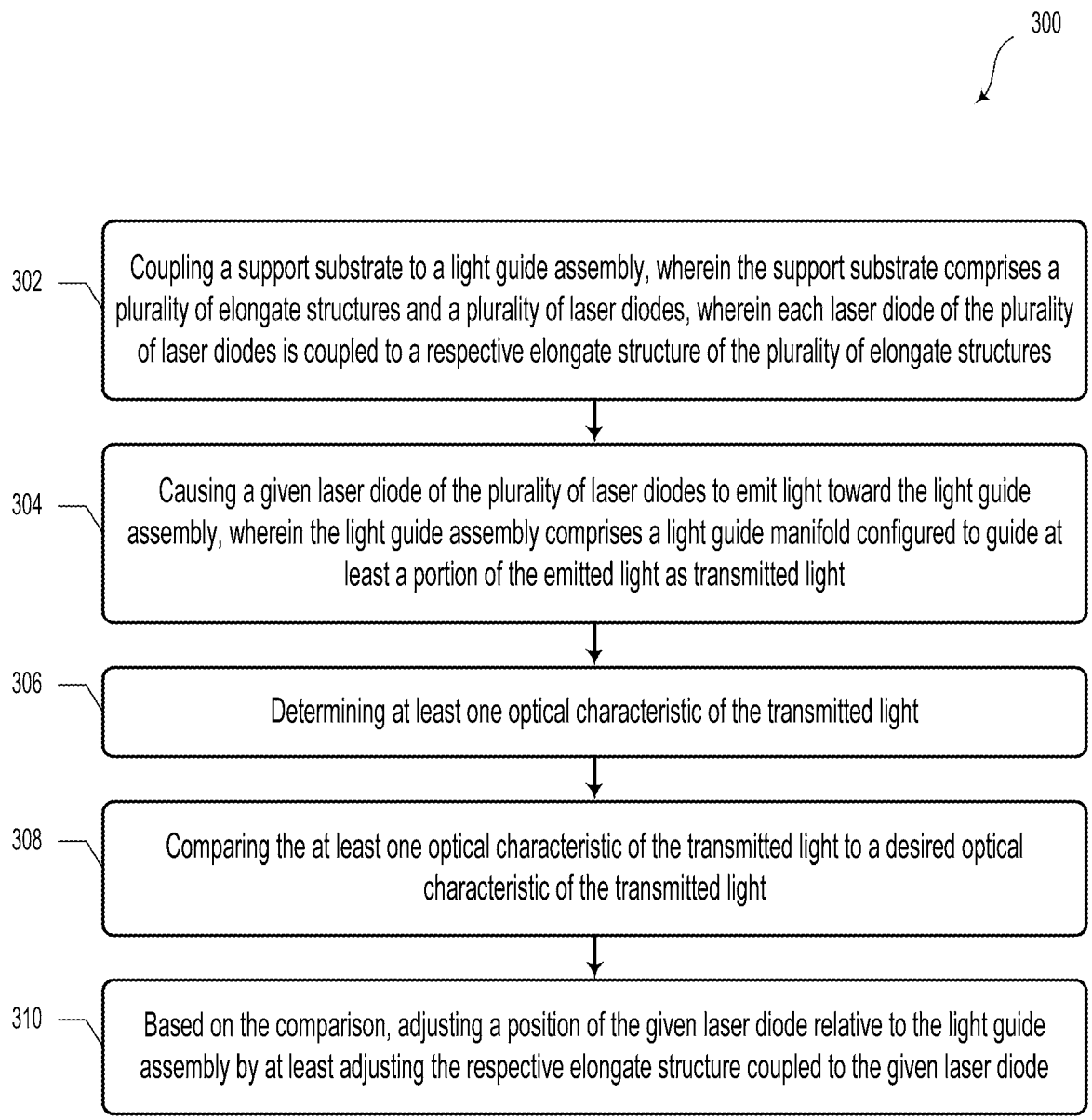
FIG. 3 illustrates a method, according to an example embodiment.

FIG. 3 illustrates a method 300, according to an example embodiment. Method 300 may be carried out, in full or in part, by system 100 and/or controller 150 as illustrated and described in reference to FIG. 1. It will be understood that the method 300 may include fewer or more steps or blocks than those expressly disclosed herein. Furthermore, respective steps or blocks of method 300 may be performed in any order and each step or block may be performed one or more times.

Block 302 includes coupling a support substrate to a light guide assembly. The support substrate includes a plurality of elongate structures and a plurality of laser diodes. Each laser diode of the plurality of laser diodes is coupled to a respective elongate structure of the plurality of elongate structures.

In some embodiments, coupling the support substrate to the light guide assembly may include applying a slow-curing epoxy to at least one of: the support substrate or the light guide assembly.

Block 304 includes causing a given laser diode of the plurality of laser diodes to emit light toward the light guide assembly. The light guide assembly includes a light guide manifold configured to guide at least a portion of the emitted light as transmitted light.

In some embodiments, causing the given laser diode of the plurality of laser diodes to emit light toward the light guide assembly includes guiding at least a portion of the transmitted light from a proximate end of the light guide manifold toward a distal end of the light guide manifold.

Block 306 includes determining at least one optical characteristic of the transmitted light. In some embodiments, determining the at least one optical characteristic of the transmitted light may include detecting the at least one optical characteristic of the transmitted light using a detector.

Additionally or alternatively, determining the at least one optical characteristic of the transmitted light could include determining at least one of: a sharpness of an image of the transmitted light at a near field location, an angle of divergence of the transmitted light at a far field location, a photon flux, or a focus spot diameter. In such scenarios, method 300 may include measuring the sharpness of the image the transmitted light using a detector at the near field location and/or measuring the angle of divergence of the transmitted light using a detector at the far field location.

Block 308 includes comparing the at least one optical characteristic of the transmitted light to a desired optical characteristic of the transmitted light. In an example embodiment, the desired optical characteristic of the transmitted light could include a stored image and/or a threshold. Comparing the at least one optical characteristic to the desired optical characteristic could include comparing a present image to the stored image or comparing, for example, a present flux value with the corresponding flux threshold. Other types of comparisons are possible and contemplated herein.

Block 310 includes, based on the comparison, adjusting a position of the given laser diode relative to the light guide assembly by at least adjusting the respective elongate structure coupled to the given laser diode. In some embodiments, adjusting the respective elongate structure coupled to the given laser diode includes adjusting an angle of the respective elongate structure such that the at least one optical characteristic of the transmitted light corresponds to the desired optical characteristic.

In some embodiments, adjusting the respective elongate structure coupled to the given laser diode may include adjusting at least one of: an actuator, a piezoelectric material, and/or a force applied to the respective elongate structure. As described herein, adjusting the respective elongate structure could include applying physical pressure with an actuator. In some embodiments, the adjustments could be made using electromagnetic, piezoelectric, acoustic, ultrasonic, or other types of forces applied via a corresponding type of actuator.

Additionally or alternatively, adjusting the respective elongate structure coupled to the given laser diode may include adjusting an angle of the respective elongate structure with respect to a plane parallel to the support substrate.

In some embodiments, adjusting the position of the given laser diode relative to the light guide assembly may be performed until the optical characteristic of the transmitted light corresponds to the desired optical characteristic. In other words, one or more steps or blocks of method 300 may be repeated or looped until the desired optical characteristic is achieved. In some cases, such optimization may include a gradual descent algorithm operable to provide smaller and smaller adjustments until an appropriate position is found. Other optimization algorithms are possible so as to ascertain an appropriate position for the laser diode relative to the light guide assembly.

Additionally, method 300 may include, after adjusting the position of the given laser diode relative to the light guide assembly, fixing the position of the given laser diode relative to the light guide assembly. As described herein, fixing the position of the given laser diode could include using epoxy or another type of fixing means to permanently fix the position of the given laser diode with respect to the light guide assembly.

The particular arrangements shown in the Figures should not be viewed as limiting. It should be understood that other embodiments may include more or less of each element shown in a given Figure. Further, some of the illustrated elements may be combined or omitted. Yet further, an illustrative embodiment may include elements that are not illustrated in the Figures.

A step or block that represents a processing of information can correspond to circuitry that can be configured to perform the specific logical functions of a herein-described method or technique. Alternatively or additionally, a step or block that represents a processing of information can correspond to a module, a segment, a physical computer (e.g., a field programmable gate array (FPGA) or application-specific integrated circuit (ASIC)), or a portion of program code (including related data). The program code can include one or more instructions executable by a processor for implementing specific logical functions or actions in the method or technique. The program code and/or related data can be stored on any type of computer readable medium such as a storage device including a disk, hard drive, or other storage medium.

The computer readable medium can also include non-transitory computer readable media such as computer-readable media that store data for short periods of time like register memory, processor cache, and random access memory (RAM). The computer readable media can also include non-transitory computer readable media that store program code and/or data for longer periods of time. Thus, the computer readable media may include secondary or persistent long term storage, like read only memory (ROM), optical or magnetic disks, compact-disc read only memory (CD-ROM), for example. The computer readable media can also be any other volatile or non-volatile storage systems. A computer readable medium can be considered a computer readable storage medium, for example, or a tangible storage device.

While various examples and embodiments have been disclosed, other examples and embodiments will be apparent to those skilled in the art. The various disclosed examples and embodiments are for purposes of illustration and are not intended to be limiting, with the true scope being indicated by the following claims.

What is claimed is:

1. A method comprising:
   providing a support substrate, wherein the support substrate comprises a plurality of elongate structures and a plurality of laser diodes, wherein each laser diode of the plurality of laser diodes is coupled to a respective elongate structure of the plurality of elongate structures;
   providing a light guide assembly, wherein the light guide assembly comprises (i) a further substrate, (ii) a light guide manifold coupled to the further substrate, and (iii) a cylindrical lens coupled to the further substrate;
   coupling the support substrate to the further substrate such that the support substrate overlaps the further substrate with the plurality of laser diodes positioned between the support substrate and the further substrate;
   causing a given laser diode of the plurality of laser diodes to emit light toward the light guide manifold via the cylindrical lens, wherein the light guide manifold is configured to guide at least a portion of the emitted light as transmitted light;
   determining at least one optical characteristic of the transmitted light;
   comparing the at least one optical characteristic of the transmitted light to a desired optical characteristic of the transmitted light; and
   based on the comparison, adjusting a position of the given laser diode relative to the light guide assembly by at least adjusting the respective elongate structure coupled to the given laser diode.

2. The method of claim 1, wherein adjusting the respective elongate structure coupled to the given laser diode comprises adjusting an angle of the respective elongate structure such that the at least one optical characteristic of the transmitted light corresponds to the desired optical characteristic.

3. The method of claim 1, wherein adjusting the respective elongate structure coupled to the given laser diode comprises adjusting an angle of the respective elongate structure with respect to a plane parallel to the support substrate.

4. The method of claim 1, wherein adjusting the position of the given laser diode relative to the light guide assembly is performed until the optical characteristic of the transmitted light corresponds to the desired optical characteristic.

5. The method of claim 1, wherein coupling the support substrate to the further substrate comprises applying a slow-curing epoxy to at least one of: the support substrate or the further substrate.

6. The method of claim 1, further comprising:
   after adjusting the position of the given laser diode relative to the light guide assembly, fixing the position of the given laser diode relative to the light guide assembly.

7. The method of claim 1, further comprising guiding at least a portion of the transmitted light from a proximate end of the light guide manifold toward a distal end of the light guide manifold.

8. The method of claim 1, wherein determining the at least one optical characteristic of the transmitted light comprises detecting the at least one optical characteristic of the transmitted light using a detector.

9. The method of claim 1, wherein determining the at least one optical characteristic of the transmitted light comprises determining at least one of: a sharpness of an image of the transmitted light at a near field location, an angle of divergence of the transmitted light at a far field location, a photon flux, or a focus spot diameter.

10. The method of claim 9, further comprising:
    measuring the sharpness of the image the transmitted light using a detector at the near field location; and
    measuring the angle of divergence of the transmitted light using a detector at the far field location.

11. The method of claim 1, wherein adjusting the respective elongate structure coupled to the given laser diode comprises adjusting at least one of: an actuator, a piezoelectric material, or a force applied to the respective elongate structure.

12. A system comprising:
    a support substrate comprising a plurality of elongate structures and a plurality of laser diodes, wherein each laser diode of the plurality of laser diodes is coupled to a respective elongate structure of the plurality of elongate structures;
    a light guide assembly comprising (i) a further substrate, (ii) a light guide manifold coupled to the further substrate, and (iii) a cylindrical lens coupled to the further substrate, wherein the support substrate is coupled to the further substrate such that the support substrate overlaps the further substrate with the plurality of laser diodes positioned between the support substrate and the further substrate;
    a detector; and
    a controller comprising at least one processor and a memory, wherein the at least one processor executes program instructions stored in the memory so as to carry out operations, the operations comprising:
      causing a given laser diode of the plurality of laser diodes to emit light toward the light guide manifold via the cylindrical lens, wherein the light guide manifold is configured to guide at least a portion of the emitted light as transmitted light;
      receiving, from a detector, information indicative of at least one optical characteristic of the transmitted light;
      comparing the at least one optical characteristic of the transmitted light to a desired optical characteristic; and
      adjusting, based on the comparison, a position of the given laser diode relative to the light guide assembly by at least adjusting the respective elongate structure coupled to the given laser diode.

13. The system of claim 12, wherein the plurality of elongate structures are coupled in a finger-like arrangement to a base portion of the support substrate.

14. The system of claim 12, wherein the operations further comprise:
determining, based on the received information, at least one of: a sharpness of an image of the transmitted light at a near field location, an angle of divergence of the transmitted light at a far field location, a photon flux of the transmitted light, or a focus spot diameter of the transmitted light.

15. The system of claim 12, wherein the operations further comprise:
adjusting the position of the given laser diode relative to the light guide assembly until the optical characteristic of the transmitted light corresponds to the desired optical characteristic.

16. The system of claim 12, wherein the plurality of elongate structures comprises a piezoelectric material, wherein adjusting the respective elongate structure coupled to the given laser diode comprises adjusting a voltage or current applied to the piezoelectric material.

17. The system of claim 12, further comprising at least one actuator, wherein adjusting the respective elongate structure coupled to the given laser diode comprises adjusting a position of the at least one actuator so as to move the respective elongate structure.

18. The system of claim 12, wherein the detector comprises at least one of a silicon photomultiplier (SiPM), a linear mode avalanche photodiode (LMAPD), a PIN diode, a bolometer, or a photoconductor.

19. The system of claim 12, wherein the light guide manifold is coupled to an aperture, wherein at least a portion of the transmitted light is transmitted through the aperture.

20. The system of claim 12, wherein the cylindrical lens comprises an optical fiber.

* * * * *